United States Patent [19]
Chen et al.

[11] Patent Number: 5,850,095
[45] Date of Patent: Dec. 15, 1998

[54] ESD PROTECTION CIRCUIT USING ZENER DIODE AND INTERDIGITATED NPN TRANSISTOR

[75] Inventors: Julian Zhiliang Chen, Dallas; Xin Yi Zhang, College Stattion; Thomas A. Vrotsos, Richardson; Ajith Amerasekera, Plano, all of Tex.

[73] Assignee: Texas Instruments Incorporated, Dallas, Tex.

[21] Appl. No.: 719,195

[22] Filed: Sep. 24, 1996

[51] Int. Cl.⁶ .................................................... H01L 23/62
[52] U.S. Cl. ......................... 257/361; 257/362; 257/363; 257/175
[58] Field of Search ..................................... 257/173, 175, 257/176, 361, 362, 363, 546, 603; 361/111, 58, 91

[56] References Cited

U.S. PATENT DOCUMENTS

| | | | |
|---|---|---|---|
| 5,223,737 | 6/1993 | Canclini ................................. | 257/546 |
| 5,276,582 | 1/1994 | Merrill et al. ......................... | 361/111 |
| 5,341,005 | 8/1994 | Canclini ................................. | 257/173 |
| 5,623,387 | 4/1997 | Li et al. ................................. | 361/56 |

OTHER PUBLICATIONS

IEEE, 1996 ieee international reliability physics proceedings, Design and Layout of a High ESD Performance NPN Structure for Submicron BiCMOS/Bipolar Circuits, pp. 227–232.

*Primary Examiner*—Carl W. Whitehead, Jr.
*Attorney, Agent, or Firm*—Lawrence J. Bassulk; Christopher L. Maginniss; Richard L. Donaldson

[57] ABSTRACT

The present invention provides a high efficiency ESD circuit that requires less space through uniform activation of multiple emitter fingers of a transistor structure containing an integral Zener diode. The Zener diode is able to lower the protection circuit trigger threshold from around 18 volts to around 7 volts. This method minimizes series impedance of the signal path, thereby rendering an NPN structure that is particularly well suited for protecting bipolar and CMOS input and output buffers. The ESD circuit of the present invention provides a relatively low shunt capacitance (typically <0.5 pF) and series resistance (typically <0.5 ohm) that are desirable for input and output circuits of present and future contemplated generations of sub-micron bipolar/BiCMOS circuit processes.

10 Claims, 2 Drawing Sheets

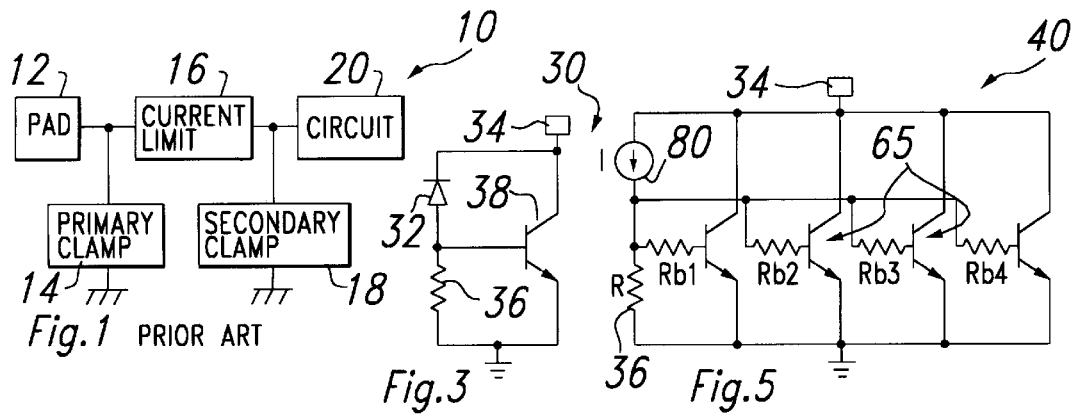
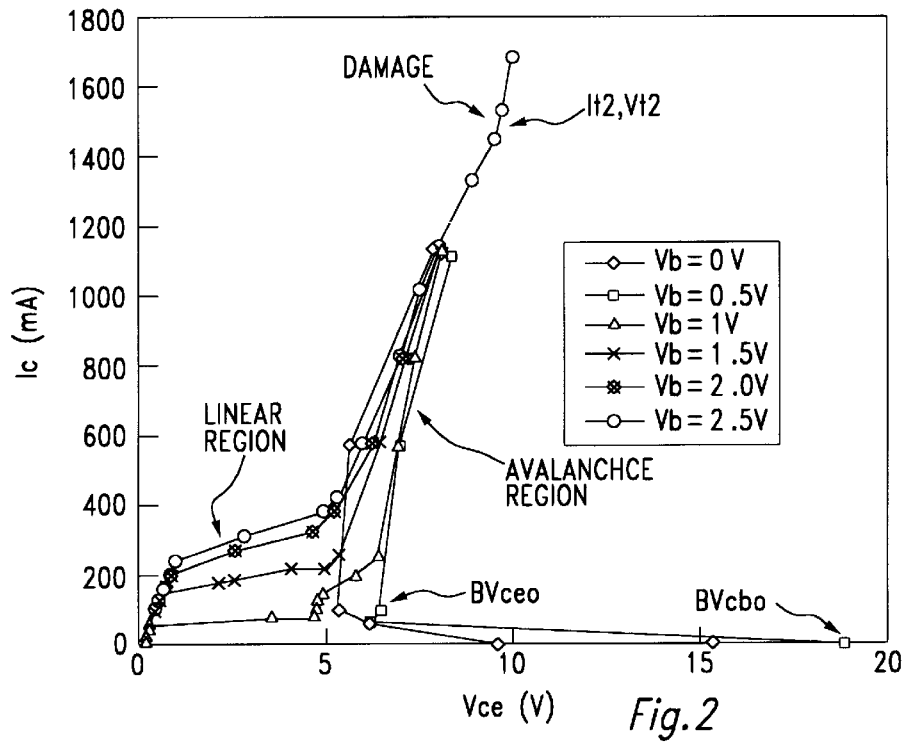
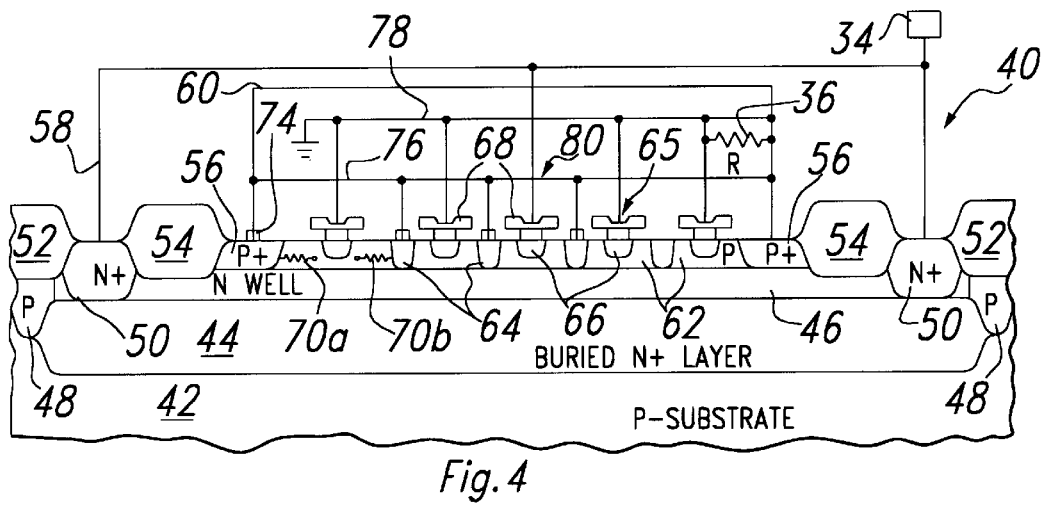

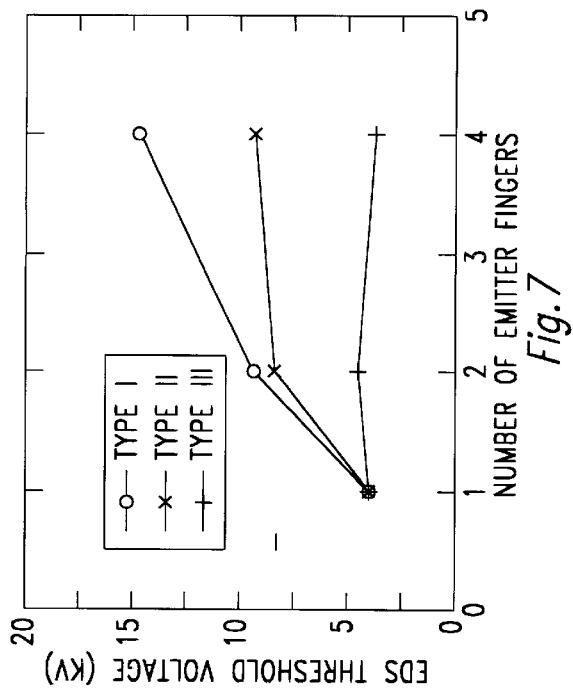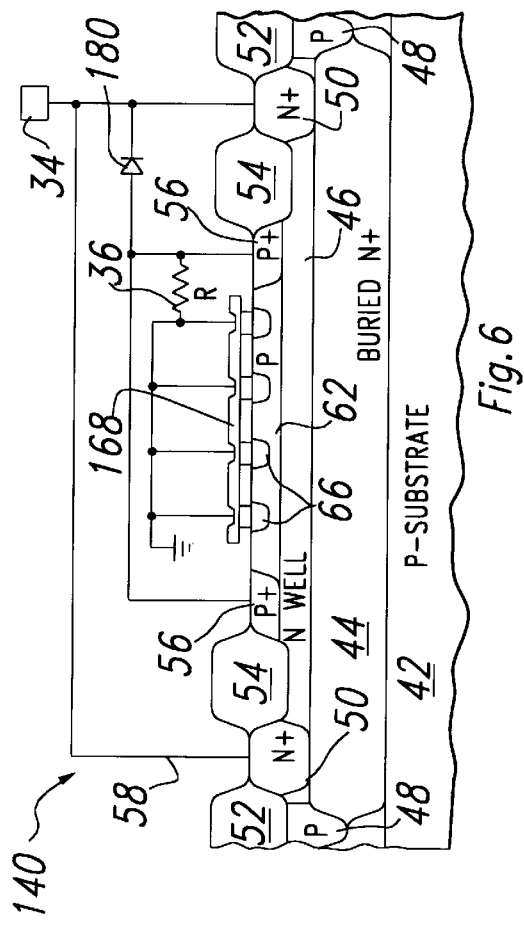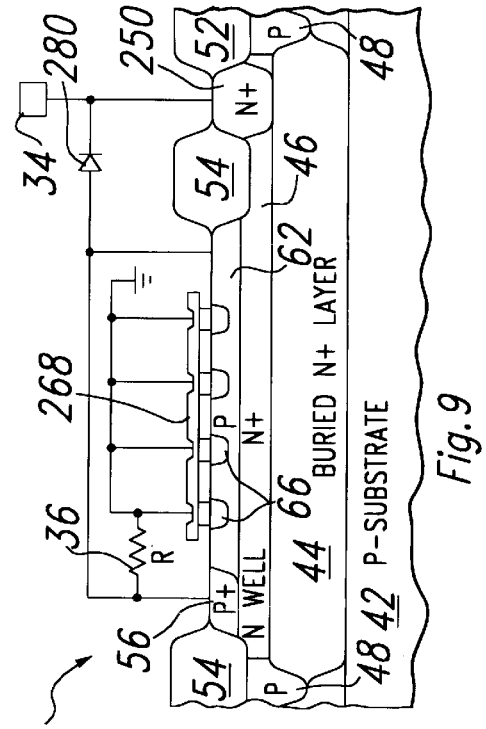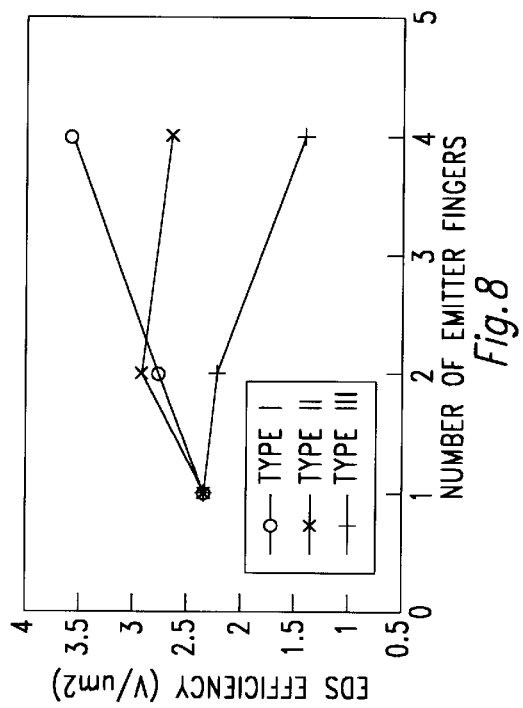

ESD PROTECTION CIRCUIT USING ZENER DIODE AND INTERDIGITATED NPN TRANSISTOR

FIELD OF THE INVENTION

This invention relates to electronic circuits, and more particularly relates to electrostatic discharge (ESD) protection circuits.

BACKGROUND OF THE INVENTION

The use of electrostatic discharge (ESD) protection circuits to protect input and output circuitry from ESD is well known, as taught in prior art U.S. Pat. Nos. 5,268,588; 4,896,243; 5,077,591; 5,060,037; 5,012,317; 5,225,702 and 5,290,724 all assigned to Texas Instruments Incorporated, the assignee herein.

Many ESD protection circuits utilize a two stage protection scheme on circuit inputs as shown in prior art FIG. 1. Typically, the high current pulse of an ESD strike passes through the primary clamp, which clamps the pad voltage. However, this is still too high a voltage for the circuitry to receive, therefore the secondary clamp clamps the voltage to a safe value. The current limit structure restricts the current flow so that the secondary clamp does not have to be excessively large.

As complimentary metal oxide semiconductor (CMOS) processes evolve to shorter transistor channel lengths and gate oxides, it becomes more difficult to protect both input and output circuits from damage due to ESD. For example, as the gate oxide of transistors becomes thinner, the breakdown voltage of the gate oxide will become lower than the breakdown voltages of the standard CMOS process flow diffusions. Therefore, the standard prior art ESD clamps will no longer protect the gate oxide from ESD because the gate oxide will fail before the ESD clamp initiates clamping of the ESD pulse.

Prior art primary clamps also suffer from limitations. They exhibit high clamping voltages that provide little headroom for "IR" drops that occur in electrostatic discharge protection circuits due to the large currents and small metallization resistance. A primary clamp circuit that could clamp ESD pulses at lower voltage levels would be beneficial.

Output circuits also suffer from low ESD level damage. If the output device evenly breaks down, it absorbs the ESD energy. However, the output device may not turn "on" completely or evenly, but rather will conduct in localized areas at a voltage value lower than the device breakdown. When this occurs, a "hot spot" is created and the device suffers damage.

Moreover, when NPN transistors are used for ESD protection in sub-micron BiCMOS and CMOS applications, the ESD threshold level typically scales with the length of the emitter finger, and not with the number of provided fingers. For example, 100 $\mu$m-length emitter NPN's have an ESD threshold of about 3.6–3.9 KV for sub-micron BiCMOS processes. As tight pad pitch in VLSI and ULSI products limits the length and size of the protective NPN transistor and establishes the ESD threshold limit, it would be desirable to provide an ESD protection circuit that meets the challenges of reduced spatial availability, increased voltage threshold, low shunt capacitance and low series resistance, preferably less than about 0.5 ohm on input and output pads.

BRIEF DESCRIPTION OF THE DRAWINGS

Further features and advantages of the present invention will become apparent from a reading of the specification in conjunction with the drawings, for which like reference characters represent corresponding parts throughout the various views and in which certain aspects of the depicted structures have been exaggerated for clarity, in which:

FIG. 1 is a block diagram illustrating a conventional ESD protection circuit;

FIG. 2 is a graph of NPN transistor base biases;

FIG. 3 is a schematic illustration of an ESD protection circuit in accordance with the present invention;

FIG. 4 is a cross-section of the circuit illustrated schematically in FIG. 3;

FIG. 5 is a further schematic illustration of the ESD protection circuit of the present invention;

FIG. 6 is a cross-section of a Type II ESD circuit;

FIG. 7 is a graph relating threshold voltage for different types of NPN transistor circuits and for numbers of emitter fingers;

FIG. 8 is a graph relating ESD efficiency for different types of NPN transistor circuits and for numbers of emitter fingers; and FIG. 9 is a cross-section of a Type III ESD circuit.

DETAILED DESCRIPTION OF PREFERRED EMBODIMENTS

The ESD circuit of the present invention provides the relatively low shunt capacitance (typically <0.5 pF) and series resistance (typically <0.5 ohm) on circuit input and output pads that are desired for the present and future contemplated generations of sub-micron bipolar/BiCMOS circuit protection schemes. In order to attain a 4 kV ESD threshold in 0.8 $\mu$m BiCMOS processes, a single 110 $\mu$m NPN transistor is required. Such an NPN transistor occupies approximately 15 $\mu$m×116 $\mu$m (=1,740 $\mu m^2$ of silicon area, thereby rendering an approximately 2.3 V/$\mu m^2$ ESD efficiency (measured in ESD volts per unit of protection area).

As will be explained in greater detail below, the ESD circuit of the present invention provides a higher efficiency, more space efficient ESD circuit that is achieved through uniform turn-on of multi-emitter fingers from an internal Zener diode current source. The Zener diode is also operable to lower the protection circuit trigger voltage from the typical ~18V to ~7V without introducing any additional series impedance into the signal path, thereby rendering an NPN structure that is particularly well suited for protecting bipolar and CMOS input and output buffers. Surface area requirements for the ESD protection circuit of the present invention amount to only about 39 $\mu$m×28.5 $\mu$m (=1,111 $\mu m^2$) to obtain a 4 kV ESD threshold voltage, resulting in an efficiency gain to ~3.6 V/$\mu m^2$ (compared to ~2.3 V/$\mu m^2$ for typical single emitter designs). The foregoing surface area reduction provides a ~56% reduction in parasitic capacitance, as compared to single emitter designs.

The foregoing difficulties and limitations in prior art ESD protection devices are illustrated in FIG. 2, which depicts a typical high current-voltage curve for an NPN transistor having different base biases. By grounding the base, the NPN triggers at collector-base breakdown ("BV") voltage $BV_{cbo}$ and snaps back to the avalanche mode to conduct the high ESD current. However, the base voltage collector-emitter breakdown voltage $BV_{ceo}$ trigger voltage is too high to protect input and output buffers in sub-micron processes. As indicated in FIG. 2, when the base is biased, the NPN can enter the avalanche mode without experiencing any snap back. Accordingly, a Zener trigger circuit 30, as illustrated generally in FIG. 3, can be incorporated into the proposed protection structure to lower the trigger voltage. The Zener trigger circuit 30 includes a Zener diode 32 that is coupled serially between pad 34 and resistor 36. The anode of the Zener diode 32 is connected to the base terminal of an NPN transistor 38, that is also coupled between the pad 34 and ground. The Zener circuit 30 is operable to reduce power dissipation when used as a primary clamp by shunting current through NPN transistor 38 (and away from an associated circuit to be protected) following breakdown of the Zener diode 32.

The Zener breakdown voltage should be designed to be slightly higher than the power supply voltage so that the protection circuit will not be activated during normal circuit operation. Under an ESD event, when the pad voltage exceeds the Zener breakdown voltage, the Zener diode 32 will conduct current to bias the base to cause the protection NPN transistor 38 to shunt the ESD to ground potential.

Prior to development of the present invention, ESD threshold voltage was known only to be scaleable as a function of emitter finger length, as opposed to the number or density of emitter fingers. In accordance with the teachings of the present invention as set forth below, ESD threshold voltage can be scaled in accordance with the provision of a Zener diode and the number of emitter fingers, thereby allowing for considerably more compact and efficient ESD circuits for further reduced geometry devices.

An high efficiency ESD protection circuit 40 having a four emitter NPN structure in accordance with the teachings of the present invention is illustrated in FIG. 4. The illustrated circuit 40 was fabricated in a 0.8 μm BiCMOS process, it being understood, however, that the principles and teachings of the present invention can be appropriately scaled upwardly or downwardly for use with different processes, such as sub-micron bipolar. The circuit 40 is comprised of a P-substrate 42 which underlies an N$^+$ buried layer 44. The P-substrate is formed from a suitable material, such as boron, that diffuses by way of lattice interstitials.

The N$^+$ buried layer is formed from a material, such as antimony, that diffuses by way of lattice vacancies. An N-well 46 overlies the buried N$^+$ layer 44 and is doped with a lattice interstitial-diffusing material, such as phosphorous. Relatively narrow P-regions or bands 48 that are doped with boron or other suitable interstitial-diffusing media at typically higher concentrations than that of the P-substrate are positioned adjacent to the ends of the buried N$^+$ layer 44 and N-well 46. Relatively narrow N$^+$ zones 50, which serve as the collector of the NPN structure of the present invention, extend from the buried N$^+$ layer 44, through the N-well 46, to extend above an upper surface of the N-well. A suitable oxide layer 52, such as SiO$_2$, is developed over the P-regions 48 and is coextensive with the lateral boundary of N$^+$ zones 50. Oxide layers 54 are also developed above the N-well 46 so as to be interposed between N$^+$ layer 44 and a P$^+$ region 56, which serve as the base of the NPN device 40. Thus, the NPN collector/N$^+$ zones 50 are electrically isolated from the P$^+$ regions/NPN base 56 by oxide layer 54 yet are electrically connected to one another and to pad 34, as indicated by electrical lead line 58. NPN base/P$^+$ regions 56 are electrically connected to one another by electrical lead line 60.

Interposed between NPN base/P$^+$ regions 56 is an alternating array of an "N+1" number of P-doped sections 62 and "N" number of P$^+$ regions 64, where "N" corresponds to the number of NPN emitters 65 to be provided. In the illustrated embodiment, and as will be explained in further detail below, the number of NPN emitters 65 is four. Accordingly, the value of N equals 4. However, it is to be appreciated that the principles and teachings of the present invention are equally applicable to ESD circuit structures having a greater or lesser number of NPN emitters.

Each NPN emitter 65 is comprised of an N+diffusion 66 that underlies, and is connected to, a polysilicon layer 68. For the Type I device shown, the polysilicon layer 68 is configured as a plurality "N+1" of discrete regions so as to permit doping of the P$^+$ implant regions 64 in a manner well known in the art. Each intrinsic base of a single NPN is comprised of an adjacent P$^+$ region 56/64 connected to a pair of extrinsic base resistors 70$a$ & 70$b$ (collectively referred to as Rb1 in FIG. 5), although only one such pair of resistors 70$a$ & 70$b$ is depicted in the drawing for the sake of simplicity. The emitters 65 are separated from one another, and are surrounded by, P$^+$ diffusion regions 56/64. All of the P$^+$ regions 56/64 are electrically connected to the NPN transistor base contacts 56 by way of a continuous silicide layer 74 over the P$^+$ region, as indicated by line 60 discussed previously. Provision of the silicide layer 74, in lieu of metal contacts, increases space efficiency of the circuit, as the layer 74 electrically connects all of the P$^+$ diffusion regions to the transistor base. Moreover, use of silicide to make the electrical connection allows for a decrease in spacing between emitter fingers, as bulky metal contacts are not required.

One terminal of circuit resistor 36 is connected to each of the grounded emitter polysilicon regions 68, as indicated by line 78. A Zener diode 80 is formed by the P-N junction formed across a centrally located pair of regions 66 and 62. The Zener diode 80 serves as the base current source and is electrically connected to the lateral N$^+$ regions by electrical lead line 58 discussed previously. Internal fabrication of the Zener diode 80 in the same tank as the NPN transistor further increases circuit space efficiency, thereby reducing demand for silicon space.

During an ESD circuit protection event, which occurs when the voltage at pad 34 exceeds the breakdown voltage for the Zener diode 80 (FIG. 5), the Zener diode 80 will conduct current to bias the NPN transistor base 56 and 64 to turn "on" transistor protection. For an ESD circuit 40 fabricated in a 0.8 μm BiCMOS process, the external base resistance is ~1 Kohm formed by a high resistance value layer (typically >~500=1 Kohm/square). A current of ~1 mA will result in a voltage of ~1V at the base terminal. As the base contacts (by way of the silicide layer 74) are spaced equidistantly from each emitter finger 65, resistance between the emitter and base of each emitter finger is the same (i.e., Rb1=Rb2=Rb3=Rb4 for the 4-emitter circuit schematic illustrated in FIG. 5). As indicated in the circuit schematic of FIG. 5 and circuit cross-section of FIG. 4, each emitter finger can be considered to act, in conjunction with the transistor base and collector, as a discrete NPN transistor. Accordingly, in this specification the plurality of NPN emitter fingers and the parallel array of NPN transistors in the ESD circuit of the present invention are to be construed as being synonymous, as each emitter finger encompasses a vertical N-P-N region. As such, the base-emitter voltage for each emitter finger NPN transistor is the same, resulting in uniform activation of the parallel array of NPN transistors. In contrast, prior art structures do not provide substantially equal base-emitter voltage across each of the emitter fingers. As such, the emitter fingers will have different voltages across them, resulting in non-uniform activation of the NPN transistors, thus reducing ESD protection circuitry efficiency.

The performance characteristics of the 4-emitter NPN ESD protection circuit of the present invention provide certain advantages over prior art ESD circuits. With reference to FIG. 6, a 4-emitter Type II ESD circuit 140 is provided. This low efficiency design differs from the ESD circuit 40 (FIGS. 4 and 5) of the present invention, most notably in having an external (180), rather than internal, current source. Moreover, discrete P+ regions 64 (FIG. 4) are not provided to separate transistor emitter legs, as the polysilicon 168 is applied as a continuous layer that does not include windows for P+ region deposition. As a consequence, performance and efficiency of the circuit 140 cannot match that of the present invention. These deficiencies are illustrated graphically in FIGS. 7 and 8, which illustrate both lower threshold voltages and (generally) decreasing efficiency for the NPN structure of both FIG. 6 (Type II) and FIG. 9 (Type III). As is shown in FIG. 9, the Type III circuit arrangement 240 differs from that of the present invention by providing an external Zener diode 280, non-spaced polysilicon 268 (hence, no windows for deposition of P+ regions 64 (FIG. 4), and only a single N+ transistor collector 250, as opposed to the dual collectors 50 provided in the present invention. Moreover, neither of the Type II (FIG. 6) or Type III (FIG. 9) designs provides a plurality of P+ diffusion regions 64,. Accordingly, such region cannot be connected by a silicide layer 74 to base contacts 56. As a result, threshold voltage, efficiency and overall circuit performance suffers as compared to the ESD protection circuit 40 of the present invention. In particular, the Type I circuit 40 (FIG. 4) exhibits more favorable threshold voltage scaling than is possible with either of the Type II or Type III designs, as threshold voltage increases nearly linearly with an increase in the number of transistor emitter fingers. Enhanced Type I threshold voltage performance is attributable to the function of the emitter fingers as a parallel array of four equivalent single emitter NPN transistors having equal, or nearly equal, base resistance values with their respective collectors tied together. Consequently, an ESD event triggers all four (FIGS. 4 and 5) NPNs simultaneously. ESD current will continuously raise the pad voltage until the parallel NPN array enter the avalanche mode to conduct the current with only a 1–2 ohm resistance.

The provision of an equal, or nearly equal, base resistance for each of the virtual NPNs is an important attribute that permits for threshold voltage to scale with the number of transistor emitters. In sub-micron bipolar/BiCMOS processes, the second breakdown voltage (Vt2) of an NPN is normally higher than is the "snap-back" voltage (BVceo), as shown in FIG. 2. Equalization of base resistance ensures that all NPNs turn "on" before the voltage across one of the NPN reaches Vt2.

Threshold voltage does not scale with the number of emitter fingers for the Type III structure due to the different base resistance values for the emitter fingers. The same holds true for the Type II structure, notwithstanding its symmetrical double collector configuration.

What is claimed is:

1. A multiple emitter electrostatic discharge circuit protection structure, comprising:
   a. a first semiconductor layer (42) having a first conductivity type;
   b. a second semiconductor layer (44) having a second conductivity type opposite that of the first semiconductor layer, disposed in overlying relation to the first semiconductor layer (42);
   c. a third semiconductor layer (46) of the second conductivity type;
   d. a plurality of first regions (50) of the second conductivity type, the first regions (50) electrically connecting with the second semiconductor layer (44);
   e. a plurality of second regions (56) laterally spaced from the plurality of first regions (50), the second regions having the first conductivity type, the second regions (56) being electrically connected to the third semiconductor layer (46);
   f. a plurality of third regions (62) and a plurality of fourth regions (64) interposed between the second regions (56), the third and fourth regions having a similar conductivity type; and
   g. a plurality of laterally spaced fifth regions (65) each at least partially physically contacting a respective third (62) region, the fifth regions each having a conductivity type dissimilar from the third (62) and fourth (64) regions.

2. The protection structure of claim 1, in which a collector of a transistor is formed by the plurality of first regions (50), in which a base of the transistor is formed by the laterally spaced second regions (56), and in which an emitter of the transistor is formed by the plurality of laterally spaced fifth regions (65).

3. The protection structure of claim 2, in which the transistor is an NPN transistor.

4. The protection structure of claim 2, in which the third (62) and fourth (64) regions are arranged in an alternating array, a portion of at least one of the third and fourth regions physically contacting the second semiconductor layer.

5. The protection structure of claim 4, in which the alternating array comprises an "n+1" number of p-doped third regions (62) and an "n" number of P+ regions (64), where "n" corresponds to the number of transistor emitter fingers to be provided.

6. The protection structure of claim 1, in which the third semiconductor layer (46) is doped at a different dopant composition or concentration level than the level of the second semiconductor layer (44).

7. The protection structure of claim 1, in which an oxide region (54) is interposed between one of the plurality of the first regions (50) and a corresponding instance of the plurality of the second regions (56).

8. The protection structure of claim 2 in which at least one of the laterally spaced fifth regions (65) is connected to the collector.

9. An electrostatic discharge circuit protection structure, comprising:
   a. a first semiconductor layer (42) having a first conductivity type;
   b. a second semiconductor layer (44) having a second conductivity type opposite that of the first semiconductor layer, disposed in overlying relation to the first semiconductor layer (42);
   c. a third semiconductor layer (46) of the second conductivity type;
   d. at least one region (50) of the second conductivity type and physically contacting the second semiconductor layer 44;
   e. at least one second region (56) laterally spaced from the first region (50) and having the first conductivity type, the second region overlying the third semiconductor layer (46);
   f. a fourth semiconductor layer (62) overlying the third semiconductor region (46) and having a conductivity type opposite that of the third semiconductor layer (46);
   g. a plurality of laterally spaced fifth regions (65) at least partially physically contacting the fourth semiconductor layer (62), the fifth regions each having a conductivity type dissimilar from the third semiconductor layer (46).

10. The protection structure of claim 9, in which the second region is connected to the anode of a nonintegral Zener diode.

* * * * *